(12) United States Patent
Campbell et al.

(10) Patent No.: US 7,956,458 B2
(45) Date of Patent: Jun. 7, 2011

(54) METAL CLAD FIBER OPTICS FOR ENHANCED HEAT DISSIPATION

(75) Inventors: Levi A Campbell, Poughkeepsie, NY (US); Casimer M DeCusatis, Poughkeepsie, NY (US); Michael J Ellsworth, Jr., Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/724,437

(22) Filed: Mar. 16, 2010

(65) Prior Publication Data

US 2010/0172099 A1    Jul. 8, 2010

Related U.S. Application Data

(62) Division of application No. 11/550,842, filed on Oct. 19, 2006, now Pat. No. 7,709,296.

(51) Int. Cl.
*H01L 23/34* (2006.01)
*H01L 21/00* (2006.01)
*H01G 5/38* (2006.01)

(52) U.S. Cl. ............... 257/714; 257/784; 257/E23.024; 257/E23.105; 438/122; 438/617; 361/699

(58) Field of Classification Search .................. None
See application file for complete search history.

(56) References Cited

U.S. PATENT DOCUMENTS

| | | |
|---|---|---|
| 4,072,188 A | 2/1978 | Wilson et al. |
| 4,381,032 A | 4/1983 | Cutchaw |
| 4,561,040 A | 12/1985 | Eastman et al. |
| 4,619,316 A | 10/1986 | Nakayama et al. |
| 4,721,996 A | 1/1988 | Tustaniwskyj et al. |
| 4,750,086 A | 6/1988 | Mittal |
| 4,909,315 A | 3/1990 | Nelson et al. |
| 5,008,061 A | 4/1991 | Bluck et al. |
| 5,083,194 A | 1/1992 | Bartilson |
| 5,168,348 A | 12/1992 | Chu et al. |
| 5,183,104 A | 2/1993 | Novotny |
| 5,220,804 A | 6/1993 | Tilton et al. |
| 5,316,075 A | 5/1994 | Quon et al. |
| 5,673,177 A | 9/1997 | Brodsky et al. |
| 5,768,103 A | 6/1998 | Kobrinetz et al. |
| 5,907,473 A | 5/1999 | Przilas et al. |
| 6,104,610 A | 8/2000 | Tilton et al. |
| 6,156,165 A | 12/2000 | Pierson et al. |

(Continued)

FOREIGN PATENT DOCUMENTS

JP    1148514    6/1989

OTHER PUBLICATIONS

T.M. Anderson et al. "Improved Multi-Mode Cooling System", IBM Technical Disclosure Bulletin, Vo.. 36, No. 06A, Jun. 1993, pp. 155-158.

(Continued)

*Primary Examiner* — Alonzo Chambliss
(74) *Attorney, Agent, or Firm* — Steven Chiu

(57) ABSTRACT

An integrated optical I/O and semiconductor chip with a direct liquid jet impingement cooling assembly are disclosed. Contrary to other solutions for packaging an optical I/O with a semiconductor die, this assembly makes use of a metal clad fiber, e.g. copper, which will actually enhance cooling performance rather than create a design restriction that has the potential to limit cooling capability.

12 Claims, 7 Drawing Sheets

U.S. PATENT DOCUMENTS

| | | |
|---|---|---|
| 6,366,462 B1 | 4/2002 | Chu et al. |
| 6,397,932 B1 | 6/2002 | Calaman et al. |
| 6,423,566 B1 | 7/2002 | Feger et al. |
| 6,498,725 B2 | 12/2002 | Cole et al. |
| 6,584,270 B2 | 6/2003 | Kashihara et al. |
| 6,587,345 B2 | 7/2003 | Chu et al. |
| 6,771,500 B1 | 8/2004 | Siegel et al. |
| 6,817,405 B2 | 11/2004 | Kamath et al. |
| 6,857,283 B2 | 2/2005 | Tilton et al. |
| 6,919,231 B1 | 7/2005 | Ramanathan et al. |
| 6,952,346 B2 | 10/2005 | Tilton et al. |
| 6,996,996 B1 | 2/2006 | Cader |
| 7,079,393 B2 | 7/2006 | Colgan et al. |
| 7,709,296 B2 * | 5/2010 | Campbell et al. ............. 438/122 |
| 2002/0075651 A1 | 6/2002 | Newton et al. |
| 2002/0135981 A1 | 9/2002 | Pautsch |
| 2002/0163782 A1 | 11/2002 | Cole et al. |
| 2004/0028094 A1 | 2/2004 | Betin et al. |

OTHER PUBLICATIONS

G.M. Chrysler et al "Jet Impingement Cold Plate for Local Temperature Control", IBM Technical Disclosure Bulletin, vol. 40, No. 11, Nov. 1997, pp. 7-8.

U.S. Military Specification MIL-G-5514G, Nov. 1, 1993, pp. 1-24.

U.S. Military Standard MS33656J, Mar. 12, 1987, pp. 1-2.

US Patent 770296 issued May 4, 2010 to Levi A. Campbell et al, U.S. Appl. No. 11/550,842, filed Oct. 19, 2006, Office Action dated Jun. 12, 2009.

US Patent 770296 issued May 4, 2010 to Levi A. Campbell et al., U.S. Appl. No. 11/550,842, filed Oct. 19, 2006, Notice of Allowance dated Dec. 21, 2009.

* cited by examiner

METAL CLAD FIBER OPTICS FOR ENHANCED HEAT DISSIPATION

CROSS REFERENCES TO RELATED APPLICATIONS

This application is a divisional of U.S. patent application Ser. No. 11/550,842, filed Oct. 19, 2006, entitled "Metal Clad Fiber Optics For Enhanced Heat Dissipation", the contents of which are incorporated by reference herein in their entirety. U.S. patent applications Ser. No. 11/427,380, filed Jun. 29, 2006, entitled "Direct Liquid Jet Impingement Module for High Heat Flux Electronics Packages"; and Ser. No. 10/904,555, filed Nov. 16, 2004, entitled "Fluidic Cooling Systems and Methods For Electronic Components", are assigned to the same assignee hereof, International Business Machines Corporation of Armonk, N.Y., and contain subject matter related, in certain respect, to the subject matter of the present application. The above-identified patent applications are incorporated herein by reference in their entirety.

BACKGROUND OF THE INVENTION

1. Technical Field of the Invention

This invention pertains to cooling semiconductor chips. In particular, this invention utilizes heretofore unused thermal channels, thereby providing enhanced heat dissipation for electronic products.

2. Description of the Prior Art

Many advanced microprocessor designs are reaching the limits of thermal dissipation which can be accommodated by air cooling alone. Examples include multi-core processors, multi-chip modules, as well as high performance microprocessors used for home entertainment. Efforts to control thermal dissipation through redesign of the chips have met with some success, but the use of air cooling places fundamental limitations on the thermal management of these systems. In addition, many of these chips require very high I/O count and high interconnect density, which has begun to push the limits of conventional electrical interconnects. In order to address both of these concerns, we propose a version of direct liquid jet cooling for these applications which incorporates metal clad optical fibers to enhance cooling performance. Metal clad fibers have been recommended in the technical literature for highly corrosive environments and for increased mechanical protection of the glass fiber but have never been designed into a microprocessor package to provide cooling enhancing properties.

SUMMARY OF THE INVENTION

The use of metal-clad glass fibers in a direct liquid jet cooling package is novel. We have determined that it is possible to design metal clad optical fiber I/O which does not compromise the integrity of the seal frame surrounding a microprocessor or other electronic device that is cooled by the use of a direct liquid jet impingement ("DLJI") module. We have calculated the effect of typical metal-clad fibers on a direct impingement cooling system, and have shown there is a demonstrable effect from using this feature. Furthermore, the use of fiber optic I/O requires optical transmitters, for example, semiconductor vertical cavity surface emitting lasers ("VCSELs"), and photodetectors to be embedded in the microprocessor or other electronic device. Both of these components add thermal loading to the system, in particular the VCSELs can add a significant amount of heat.

Thus, there is a need for the cooling enhancements afforded by the metal clad fibers in this application. It may not be practical to incorporate optical I/O without the benefit of this cooling. This design has potential to be incorporated into commercial product offerings from IBM and other companies since other companies are also exploring the feasibility of liquid cooling in future designs.

An integrated optical I/O and semiconductor chip with a DLJI cooling assembly are disclosed. Contrary to other solutions for packaging an optical I/O with a semiconductor die, this assembly makes use of a metal clad fiber, e.g. copper, which will actually enhance cooling performance rather than create a design restriction that has the potential to limit cooling capability.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications. The figures below are not intended to be drawn to any accurate scale with respect to size, shape, angular relationship, spatial relationship, or relative positions.

BEST MODE FOR CARRYING OUT THE INVENTION

Figure 1:
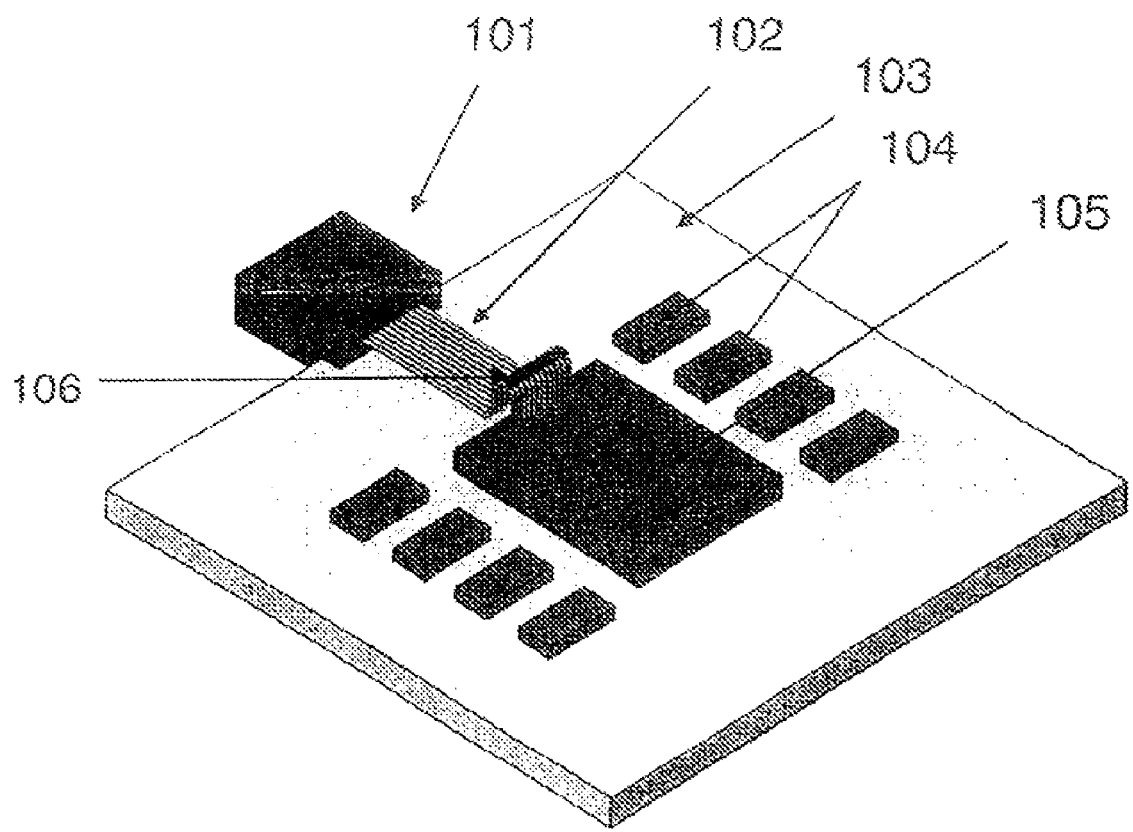
FIG. 1 illustrates a typical layout of a printed circuit board, semiconductor substrate, or similar multi-chip module assembly.

FIG. 1 shows a typical layout of a printed circuit board, semiconductor multiple chip module, or similar substrate assembly. In this example there is illustrated a microprocessor 105 as an example semiconductor main processor chip, decoupling capacitors 104, which could alternately be additional discrete semiconductor devices including multiple processors, or processor units, or memory chips, and fiber optic I/O connector 101. A ribbon of metal clad optical fibers 102 runs from the microprocessor 105 to the edge of the substrate 103, where it terminates in the optical connector 101. Wiring within substrate 103 provides electrical communication coupling between the devices mounted thereon. The metal clad fibers 103 are flexed near their point of contact with microprocessor 105 to provide strain relief and facilitate attachment to the microprocessor. The flex point can be placed at other points along the fibers or mechanical strain relief devices can be used. Laser sources, such as VCSELs, are mounted within the microprocessor for communicative optical coupling with the attached optical fibers. The substrate in this example could be composed of plastic, ceramic, or any other material suitable for securing and electrically coupling semiconductor devices. An optional stabilizing strip 106 can be attached across the metal clad fibers, preferably near the top of the flexed clad fiber arch, made from a thermally conductive material which would provide an additional heat dissipation path for heat traveling through the metal clad fibers and would also provide mechanical stabilization for the metal clad fibers.

Multiple fiber connectors 101 could be attached to the substrate for coupling multiple ribbons of clad fibers to other ones of the semiconductor devices. Additionally, the clad fiber ribbon as shown contains a plurality of clad fibers which could be coupled to several semiconductor chips mounted on the substrate.

Figure 2:
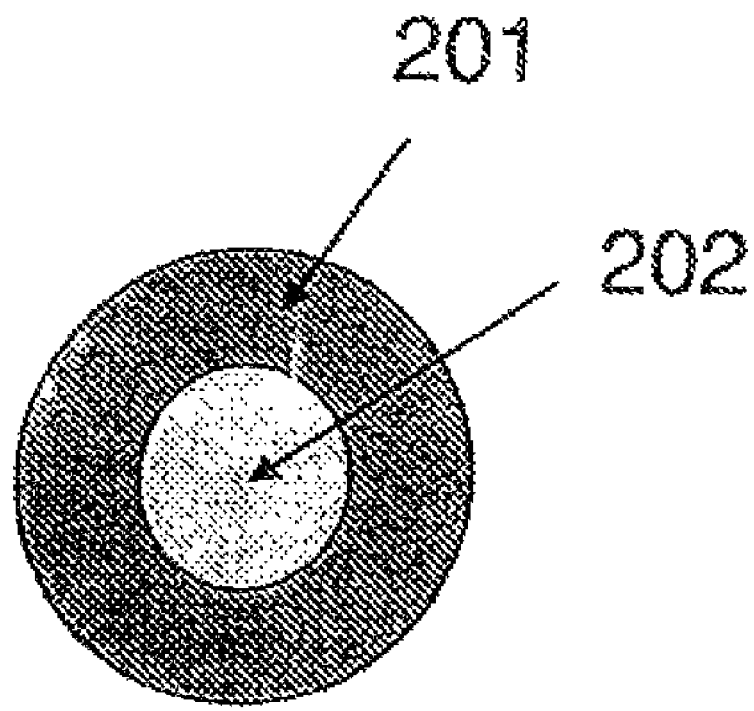
FIG. 2 illustrates a detailed cross section of an optical fiber having a metallic cladding.

FIG. 2 illustrates a detailed cross section of a prior art optical fiber 202 having a metallic cladding 201. Various types of metal can be used as cladding, although we have assumed copper in this preferred embodiment. Other materials that could be used include aluminum, gold, silver, among others. The metal provides a coating around a conventional glass fiber (for example, a multimode fiber with a 50 micron glass core and 125 micron metal cladding). Other commonly available glass cores or claddings may have other dimensions, such as 62.5 micron optical fiber, however, the dimensions of the fiber and cladding are not an essential aspect of the present invention. The microprocessor I/O is carried as an optical signal in the glass fiber, while the metal outer cladding serves as a thermal conductor, and providing other advantages as outlined above, in this illustrated embodiment.

Figure 3:
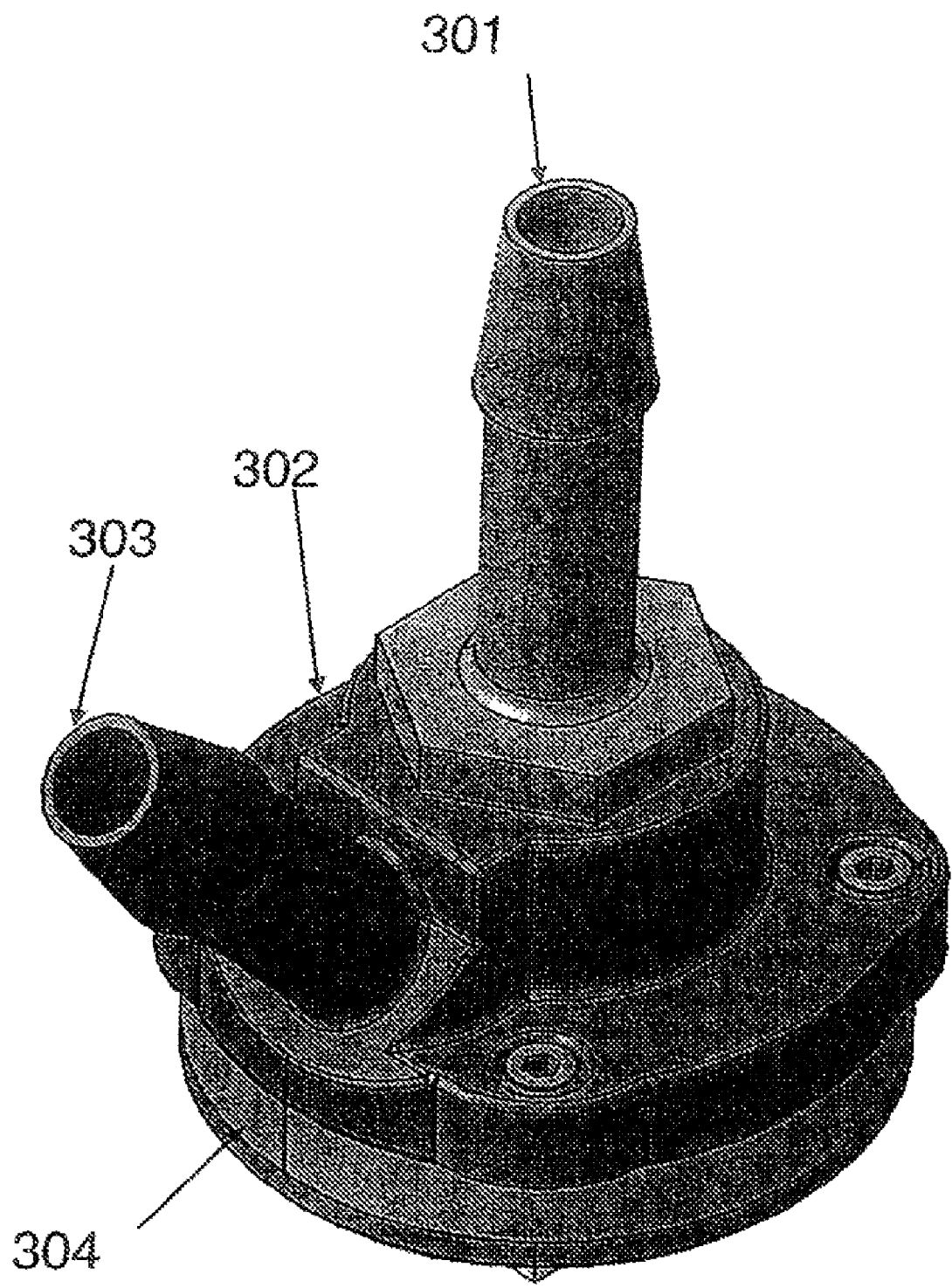
FIG. 3 illustrates a design for the direct liquid jet impingement cooling module.

FIG. 3 illustrates a proposed design for the direct liquid jet impingement ("DLJI") cooling module 302. As shown in the figure, this module receives a cooling fluid via liquid supply opening 301 then directs the cooling fluid directly onto an upper surface of a microprocessor or other electronic device. The fluid is then directed across the top surface of the electronic device, then to the sides of the device where it is returned through a liquid return path 303. A sealing frame 304 together with a sealing material secures the DLJI module around the microprocessor chip or other semiconductor device. Preferred sealants include GE3280, a silicone adhesive produced by General Electric, of Fairfield, Conn.; Sylgard 577 Silicone produced by Dow Corning; or AbleBond 84-3, an electrically insulating epoxy chip adhesive; or AbleBond 7900 epoxy with sputtered metal coating, the latter two produced by Ablestik Company of Rancho Dominguez, Calif. However, other sealants having a preferred property of providing a fluid tight seal can be used. A more detailed view of the seal frame assembly is shown below, including the means to accommodate metal clad optical fibers which act as extended surfaces for heat transfer to enhance convection cooling.

Figure 4:
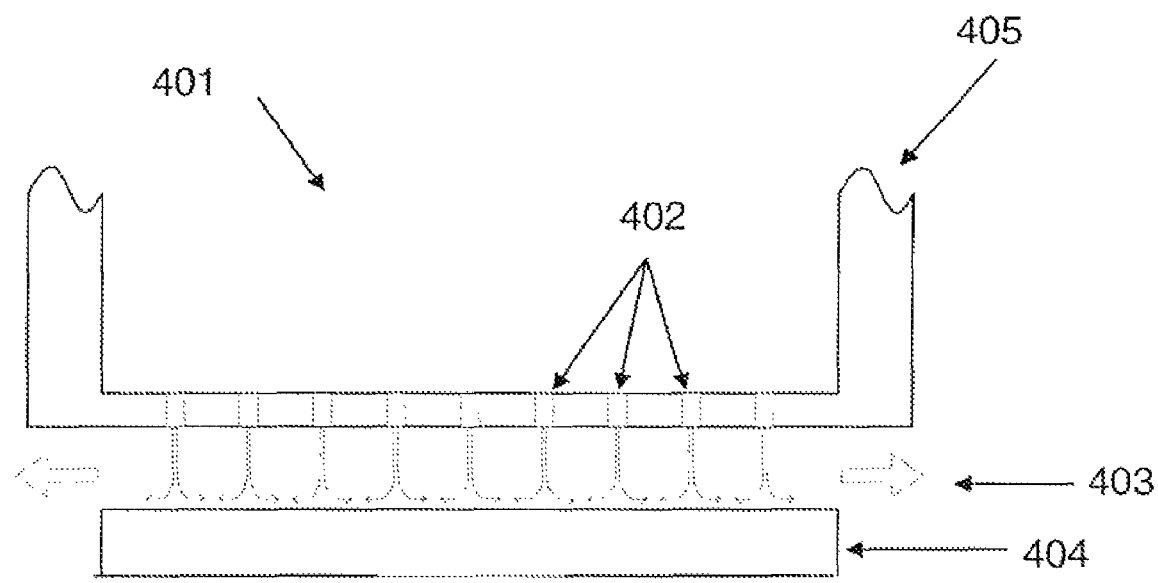
FIG. 4 illustrates a generalized side cross section view of the cooling fluid flow of the present invention.

FIG. 4 illustrates a cross section of a portion of a DLJI module 405 providing cooling fluid flow 403 over a top surface of an electronic device 404, which is typically mounted on a substrate though not shown as such in this figure. The fluid is ejected under pressure through a plurality of openings 402 in the bottom of an inlet plenum 401 of the DLJI module (shown as an orifice plate in FIG. 5). The pressure is provided by flowing the cooling fluid through the inlet 301 and out through the outlet 303. By disposing the DLJI over the electronic device the pressurized cooling fluid will contact, and flow over, the electronic device to carry away heat transferred from the electronic device to the cooling fluid. As illustrated more clearly in FIG. 6, the heat dissipation provided by the cooling fluid is enhanced through use of metal clad fibers. The cooling fluid flow over the metal clad fibers will provide added heat dissipation due to the metal clad fibers being thermally coupled to the heated semiconductor chip and thereby provide additional thermal channels for heat to escape therefrom. Various cooling fluids may be appropriate for use in the examples illustrated herein, such as water; dielectrics such as FC72—a fluorocarbon manufactured by 3M; refrigerants such as R134A; or liquid metals such as mercury, gallium, and related alloys.

Figure 5:
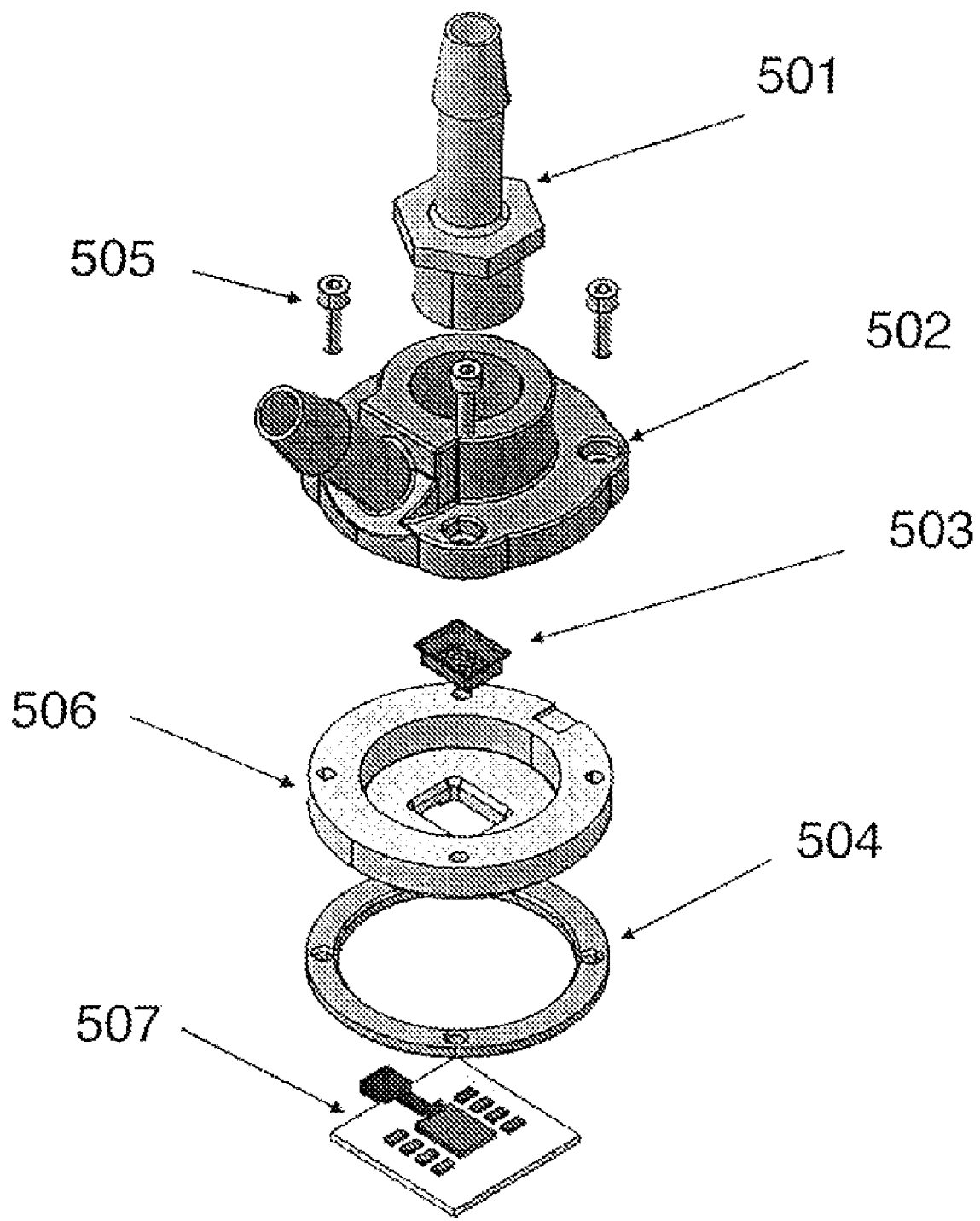
FIG. 5 illustrates an exploded view of the direct liquid jet impingement cooling module and an example layout of the printed circuit board shown in FIG. 1.

FIG. 5 illustrates an exploded view of the DLJI module showing inlet fitting 501, DLJI manifold 502, orifice plate 503, fastening ring 504, fasteners 505, and sealing frame 506. A small notch at the bottom of sealing frame 506 accommodates the metal clad fibers when the sealing frame is placed in position on the substrate surrounding the microprocessor chip. The microprocessor module with optical I/O of FIG. 1 is shown at 507 in relative position to the DLJI module apparatus.

Figure 6:
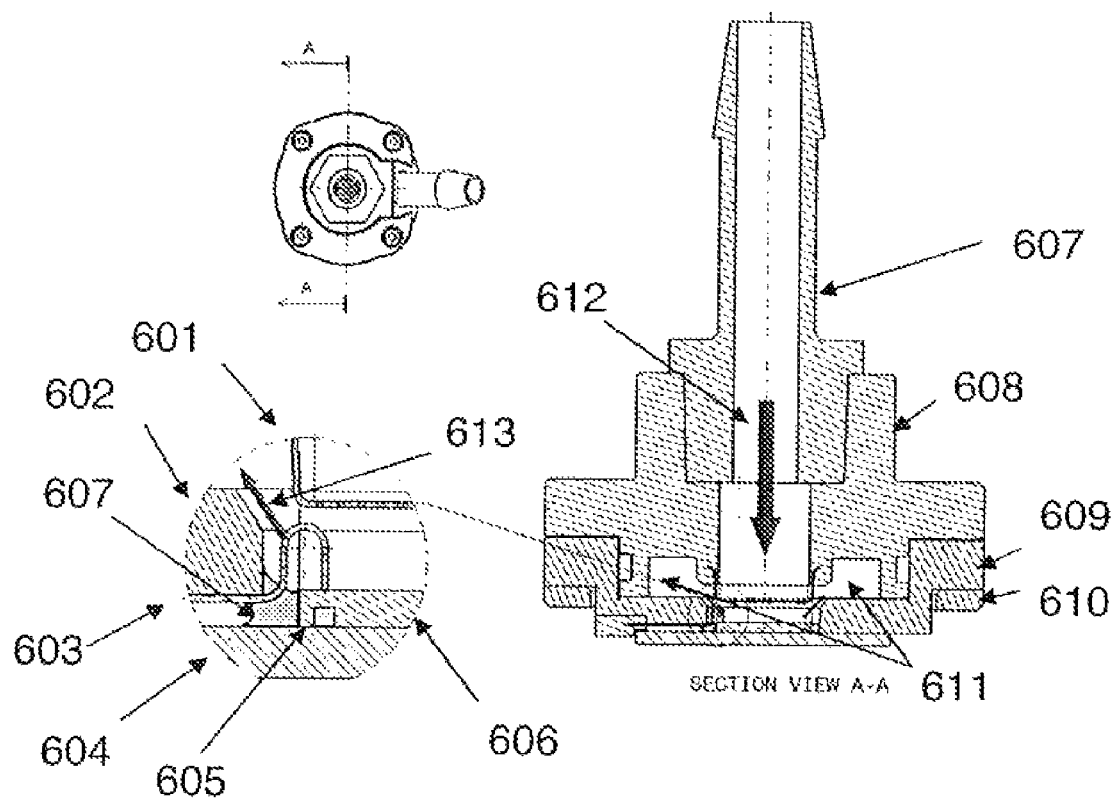
FIG. 6 illustrates a cross section view of the direct liquid jet impingement cooling module and an expanded view of the sealing meniscus.

FIG. 6 illustrates a cross section of a DLJI module attached to the microprocessor module of FIG. 1. The inlet fitting 607 sits within the DLJI manifold 608 which sits within sealing frame 609 which further is seated within fastening ring 610. The expanded view illustrates orifice plate 601 above microprocessor die 606 which is sealed to the substrate 604 and to sealing frame 602 by sealing material 607. The sealant should make fluid tight contact at least with the semiconductor device 606 and the sealing frame 602 such that cooling fluids used would not be able to reach the substrate surface. If the semiconductor device 606 includes metallurgy on its bottom surface such that it is raised above the top surface of the substrate then the sealant should be disposed at least between the semiconductor device and the sealing frame, and optionally contacting the substrate, so that cooling fluid does not leak into contact with any such metallurgy. The clad fiber 603 is shown passing through sealing material 607. Also shown is a VCSEL 605 which is in optical communication with the terminal end of metal clad fiber 603.

The general path of cooling fluid through the assembled apparatus of FIG. 6 is as follows: cooling fluid enters the inlet fitting 607 through the inlet opening at the top and flows in a downward direction represented by the arrow 612. With respect to the expanded view, the cooling fluid passes over microprocessor 606 then flows away from the microprocessor by passing over or, optionally, through metal clad fibers 603, as represented by arrow 613, into a channel 611 that is coupled to the outlet (303 of FIG. 3) for returning the cooling fluid.

With respect to the expanded view showing cooling fluid passing through the metal clad fiber 603, the metal clad fibers might optionally be stabilized by a jacket laminate that holds them together, as in a ribbon, and in parallel. Hence, the cooling fluid might not be able to pass through and underneath the metal clad fiber as in the present preferred embodiment illustrated in the expanded view of FIG. 6. In such a case, the fluid might pass mostly over the top of the flexed metal clad fibers before being expelled from the DLJI module. Although this would provide an enhanced heat transfer cooling effect, it would not be as effective as the preferred embodiment wherein the cooling fluid flows through and between the metal clad fibers.

Figure 7:
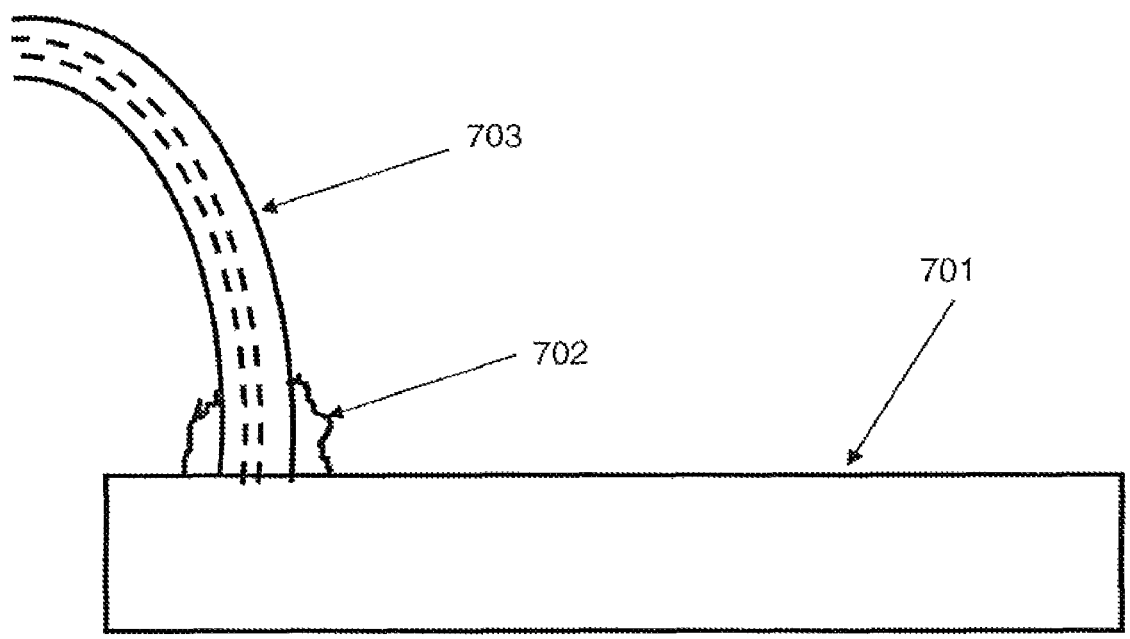
FIG. 7 illustrates a thermally conductive epoxy or solder coupling a metal clad fiber to a semiconductor die.

Referring to FIG. 7, a thermally conductive epoxy, such as TIGA HTR-815 silver filled epoxy from Resin Technology Group, LLC, of South Easton, Mass., or a solder 702 is used to assist in securing metal clad fiber 703 to microprocessor die or other electronic device 701 and to provide a thermally conductive path from the microprocessor die to the metal cladding. Heat generated by electric currents flowing in the wiring within die 701 increases the surface temperature of the die which then transmits heat to the metal cladding via the epoxy or solder. Optionally, the metal clad fiber can be attached to the die without use of an epoxy or solder so long as the metal cladding is in direct contact with the heated surface of the die so that a thermal pathway from the die to the metal cladding is established.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

We claim:

1. Apparatus comprising:
    a semiconductor chip;
    a metal clad fiber optically coupled to the semiconductor chip for transmitting data from the semiconductor chip and thermally coupled to the semiconductor chip for conducting heat from the semiconductor chip; and
    a DLJI module disposed over the semiconductor chip for circulating cooling fluid over the semiconductor chip for contacting at least the metal clad fiber.

2. Apparatus of claim 1, wherein a metal of the metal clad fiber is selected from the group consisting of aluminum, gold, copper, and silver.

3. Apparatus of claim 1 further comprising an epoxy for thermally coupling a metal of the metal clad fiber to the semiconductor chip.

4. Apparatus of claim 1, wherein the DLJI module includes an inlet and an outlet for circulating substantially all of the cooling fluid.

5. Apparatus of claim 4 further comprising a seal for coupling the DLJI module around the semiconductor chip for providing a substantially fluid-tight fit.

6. Apparatus of claim 5 wherein the seal is comprised of a flexible sealing material disposed between the DLJI module and at least a substrate upon which the semiconductor chip is attached.

7. Apparatus of claim 5 wherein the seal is comprised of an electrically insulating silicone adhesive material.

8. Apparatus of claim 1, wherein the DLJI module includes an inlet plenum disposed over the semiconductor chip and at least one ejection outlet for ejecting the cooling fluid onto the semiconductor chip and over the metal clad fibers.

9. Computer system comprising:
    a chip substrate for communicatively coupling a plurality of semiconductor chips fastened thereon;
    metal clad fibers physically and communicatively coupled to at least one of said semiconductor chips for transmitting data to and from said at least one of said semiconductor chips and for conducting heat away from said at least one of said semiconductor chips; and
    a DLJI module disposed over said at least one of said semiconductor chips for circulating cooling fluid for contacting at least the metal clad fibers.

10. Computer system according to claim 9, wherein the DLJI module includes an inlet and an outlet for circulating substantially all of the cooling fluid.

11. Computer system according to claim 9 further comprising a seal for coupling the DLJI module around the semiconductor chip for providing a substantially fluid-tight fit.

12. Computer system according to claim 9, wherein a metal of the metal clad fibers is selected from the group consisting of aluminum, gold, copper, and silver.

* * * * *